(12) United States Patent
Frey

(10) Patent No.: US 10,948,641 B2
(45) Date of Patent: Mar. 16, 2021

(54) INTERFERENCE FILTER

(71) Applicant: Commissariat à l'Énergie Atomique et aux Énergies Alternatives, Paris (FR)

(72) Inventor: Laurent Frey, Fontaine (FR)

(73) Assignee: Commissariat à l'Énergie Atomique et aux Énergies Alternatives, Paris (FR)

(*) Notice: Subject to any disclaimer, the term of this patent is extended or adjusted under 35 U.S.C. 154(b) by 312 days.

(21) Appl. No.: 15/920,349

(22) Filed: Mar. 13, 2018

(65) Prior Publication Data
US 2018/0267220 A1    Sep. 20, 2018

(30) Foreign Application Priority Data

Mar. 14, 2017 (FR) .................................. 17/52067

(51) Int. Cl.
*G02B 5/28* (2006.01)
*H01L 27/146* (2006.01)
(Continued)

(52) U.S. Cl.
CPC ............. *G02B 5/286* (2013.01); *G02B 5/201* (2013.01); *G02B 5/285* (2013.01);
(Continued)

(58) Field of Classification Search
CPC ........ G02B 5/286; G02B 5/285; G02B 5/201; G02B 5/288; H01L 27/14649;
(Continued)

(56) References Cited

U.S. PATENT DOCUMENTS 7,759,679 B2    7/2010 Inaba et al.
8,766,385 B2    7/2014 Gidon et al.
(Continued)

FOREIGN PATENT DOCUMENTS

EP    2 991 115 A1    3/2016
FR    2 994 282 A1    2/2014
(Continued)

OTHER PUBLICATIONS

French Search Report for Application No. FR1752067 dated Dec. 6, 2017.

*Primary Examiner* — Kimberly N. Kakalec
(74) *Attorney, Agent, or Firm* — Wolf, Greenfield & Sacks, P.C.

(57) ABSTRACT

An interference filter, including a first interface layer; a first dielectric portion of a first dielectric material, having a first thickness and resting on the first interface layer at a first location; a second dielectric portion of the first dielectric material, the second dielectric portion resting on the first interface layer at a second location, the second dielectric portion having a second thickness greater than the first thickness; a third dielectric portion of a second dielectric material having a refraction index smaller than the refraction index of the first material, the third dielectric portion having a third thickness and resting on the first dielectric portion, the sum of the first thickness and of the third thickness being equal to the second thickness; and a second interface layer resting on the second and third dielectric portions.

11 Claims, 7 Drawing Sheets

(51) Int. Cl.
    *G02B 5/20*    (2006.01)
    *H04N 5/225*   (2006.01)
(52) U.S. Cl.
    CPC .. *H01L 27/14621* (2013.01); *H01L 27/14645* (2013.01); *H01L 27/14649* (2013.01); *H01L 27/14685* (2013.01); *H04N 5/2254* (2013.01); *H01L 27/14625* (2013.01)
(58) Field of Classification Search
    CPC ......... H01L 27/14685; H01L 27/14645; H01L 27/14621; H01L 27/14625; H04N 5/2254
    See application file for complete search history.

(56)            References Cited

U.S. PATENT DOCUMENTS

| | | | |
|---|---|---|---|
| 8,933,389 B2 | 1/2015 | Boutami et al. | |
| 2006/0169878 A1* | 8/2006 | Kasano | G06K 9/00006 250/226 |
| 2008/0251873 A1* | 10/2008 | Kasano | H01L 27/14632 257/432 |
| 2015/0009570 A1* | 1/2015 | Amano | G02B 1/11 359/601 |

FOREIGN PATENT DOCUMENTS

| | | |
|---|---|---|
| FR | 3 020 878 A1 | 11/2015 |
| WO | WO 2010/046369 A1 | 4/2010 |
| WO | WO 2010/139794 A1 | 12/2010 |
| WO | WO 2012/010812 A1 | 1/2012 |

* cited by examiner

INTERFERENCE FILTER

This application claims the priority benefit of French patent application number 17/52067, the content of which is hereby incorporated by reference in its entirety to the maximum extent allowable by law.

BACKGROUND

The present disclosure relates to an interference filter, particularly for an image sensor, and to a method of manufacturing such an interference filter.

DISCUSSION OF THE RELATED ART

It is known to form arrays of interference filters, particularly for image sensors, also called imagers, in the visible, infrared (particularly from 650 nm to 1,050 nm), and/or ultraviolet range, which require separating a plurality of frequency ranges. Such an array of filters is also called pixelated filter, a filter pixel, or elementary filter, corresponding to the smallest element of the filter having the same filtering properties.

An example of application of a pixelated filter corresponds to a color image sensor. The pixelated filter may then comprise first filter pixels letting through red light, second filter pixels letting through green light, and third filter pixels letting through blue light. The filter pixels may then have substantially the same lateral dimensions as the photodetection sites of the sensor.

Another example of application of a pixelated filter corresponds to an image sensor compensating the wavelength shift under a spatially variable incidence. Indeed, the radiation which reaches the sensor may have an incidence, relative to the exposed surface of the sensor, which increases as the distance from the center of this surface increases. The pixelated filter may then comprise different filter pixels receiving the radiation at different incidences, the spectral responses of each filter pixel being substantially identical whatever the incidence.

An interference filter is formed by a stacking of a plurality of layers. As an example, an interference filter may comprise a stack of semi-reflective metal layers separated by dielectric layers and/or an alternation of dielectric layers having different refraction indexes, also called optical indexes hereafter. The thicknesses of the filter layers depend on the desired filtering properties.

The forming of a pixelated filter requires forming dielectric layers having different thicknesses according to the considered filter pixel. The pixelated filter manufacturing method then generally comprises depositing a dielectric layer over the entire structure and etching the dielectric layer to only keep the dielectric layer on certain filter pixels. The next dielectric or metal layer is then deposited on a surface having reliefs or steps, which causes a transfer of the relief from layer to layer up to the top of the stack.

Generally, the layer depositions are at least partially conformal, that is, the layer deposits not only on the horizontal surfaces in the plane of the layers, but also on the sides of the previously-etched layers. A lateral spacer, or transition area, thus forms for each successive deposition as soon as a relief is present. The lateral dimension of the transition area between two adjacent filter pixels thus increases according to depositions, between the initial relief and the top of the stack.

A disadvantage is that if part of the light reaches the spacers, this causes a loss of signal by scattering and/or a distortion of the spectral responses of the filter pixels. Such losses may become significant when the spacer width is not negligible with respect to the lateral dimension, or size, of the filter pixel. This may in particular occur in the case of small filter pixels, having a lateral dimension smaller than 2 µm, even when the layers of the interference filter have a thickness of a few hundreds of nanometers. This may also occur for larger filter pixels, having a lateral dimension greater than 2 µm, with layers of the interference filter of a few micrometers.

Document U.S. Pat. No. 8,933,389B2 describes an optical filter comprising pads of nanometer-range dimensions made of a first dielectric material and embedded in a layer of a second dielectric material having a different refraction index, the space between pads and the lateral dimensions of the pads being adjusted according to the desired filtering. A disadvantage of such a filter is that the interval between pads should be much smaller than the wavelength of the filtered radiation. The pad manufacturing then requires high-resolution lithography methods, for example, immersion lithography methods or electronic lithography methods. However, immersion lithography methods are generally only used at an industrial scale for the first steps of the manufacturing of an integrated circuit, particularly for MOS transistor manufacturing. Further, the write speeds of electronic lithography methods are generally too slow for an application at an industrial scale.

SUMMARY

An object of an embodiment is to overcome all or part of the disadvantages of the described interference filters and of their manufacturing methods.

Another object of an embodiment is to be able to manufacture the interference filter with standard optical lithography equipment.

Another object of an embodiment is to decrease the lateral dimensions of the spacers of the interference filter.

Thus, an embodiment provides an interference filter comprising:

a first planar interface layer, metallic or comprising a stack of at least two dielectric layers with a difference between refraction indexes greater than or equal to 0.5;

a first dielectric portion of a first dielectric material or of first dielectric materials, the first dielectric portion having a first thickness and resting on the first interface layer at a first location;

a second dielectric portion of the first dielectric material or of the first dielectric materials, the second dielectric portion resting on the first interface layer at a second location, the second dielectric portion having a second thickness greater than the first thickness;

a third dielectric portion of a second dielectric material, the refraction index of the second material at an operating wavelength of the filter being smaller than the refraction index of the first material or of the first materials at said wavelength, the third dielectric portion having a third thickness and resting on the first dielectric portion, the sum of the first thickness and of the third thickness being equal to the second thickness; and a second planar interface layer, metallic or comprising a stack of at least two dielectric layers with a difference between refraction indexes greater than or equal to 0.5, resting on the second and third dielectric portions in contact with the second and third dielectric portions.

According to an embodiment, the interference filter further comprises a fourth dielectric portion of the first dielectric material or of the first dielectric materials, the fourth dielectric portion resting on the first interface layer at a third location, the fourth dielectric portion having a fourth thickness between the first thickness and the second thickness.

According to an embodiment, the interference filter further comprises a fifth dielectric portion of the second dielectric material, the fifth dielectric portion having a fifth thickness and resting on the fourth dielectric portion, the sum of the fourth thickness and of the fifth thickness being equal to the second thickness.

According to an embodiment, the interference filter further comprises a sixth dielectric portion of the first dielectric material or of the first dielectric materials, the sixth dielectric portion resting on the first interface layer at a fourth location, the sixth dielectric portion having a sixth thickness between the fourth thickness and the second thickness.

According to an embodiment, the interference filter further comprises a seventh dielectric portion of the second dielectric material, the seventh dielectric portion having a seventh thickness and resting on the sixth dielectric portion, the sum of the sixth thickness and of the seventh thickness being equal to the second thickness.

According to an embodiment, the first dielectric material or the first dielectric materials are selected from the group comprising silicon nitride, amorphous silicon, hafnium oxide, aluminum oxide, a film made up of aluminum, oxygen, and nitrogen, a film made up of silicon, oxygen, carbon, and nitrogen, silicon nitride, niobium oxide, tantalum oxide, titanium oxide, hydrogenated amorphous silicon, and mixtures of at least two of these compounds.

According to an embodiment, the second dielectric material is selected from the group comprising silicon dioxide, magnesium fluoride, silicon oxide, silicon oxynitride, hafnium oxide, aluminum oxide, a film made up of aluminum, oxygen, and nitrogen, a film made up of silicon, oxygen, carbon, and nitrogen, silicon nitride, and mixtures of at least two of these compounds.

According to an embodiment, the interference filter comprises:

N dielectric portions of the first dielectric material or of the first dielectric materials resting on the first interface layer, where N is an integer greater than or equal to 2, the $i^{th}$ dielectric portion of the first dielectric material or of the first dielectric materials, where i is an integer in the range from 1 to N, comprising a stack of i layers of the first dielectric material or of the first dielectric materials, the thickness of the $j^{th}$ dielectric portion of the first dielectric material or of the first dielectric materials, where j is an integer in the range from 1 to N−1, being smaller than the thickness of the $k^{th}$ dielectric portion of the first dielectric material or of the first dielectric materials, where k is equal to j+1;

N−1 dielectric portions of the second dielectric material, the $j^{th}$ dielectric portion of the second dielectric material resting on the $j^{th}$ dielectric portion of the first dielectric material or of the first dielectric materials, the sum of the thickness of the $j^{th}$ dielectric portion of the second dielectric material and of the thickness of the $j^{th}$ portion of the first dielectric material or of the first dielectric materials being equal to the thickness of the $N^{th}$ dielectric portion of the first dielectric material or of the first dielectric materials.

According to an embodiment, the interference filter comprises, for each $j^{th}$ and $k^{th}$ dielectric portion of the first dielectric material or of the first dielectric materials, a transition area between the $j^{th}$ and $k^{th}$ dielectric portions of the first dielectric material or of the first dielectric materials, the thickness of the transition area varying from the thickness of the $j^{th}$ dielectric portion of the first dielectric material or of the first dielectric materials to the thickness of the $k^{th}$ dielectric portion of the first dielectric material or of the first dielectric materials, the maximum lateral dimension of the transition area, measured orthogonally to the stacking direction, being smaller than 50 nm.

An embodiment also provides an image sensor comprising the previously-defined interference filter and the interference filter comprises a first elementary filter comprising the first portion and the third portion and a second elementary filter comprising the second portion.

According to an embodiment, the sensor is a color image sensor, the first elementary filter is a bandpass filter centered on a first wavelength and the second elementary filter is a bandpass filter centered on a second wavelength.

According to an embodiment, the sensor is a color image sensor, the first elementary filter is a bandpass filter centered on a third wavelength for a radiation at a first incidence relative to the interference filter and the second elementary filter is a bandpass filter centered on the third wavelength to within 1% for the radiation at a second incidence relative to the interference filter.

An embodiment also provides a method of manufacturing an interference filter such as previously defined, comprising the successive steps of:

a) depositing a first dielectric layer of the first dielectric material or of the first dielectric materials on the first interface layer;

b) etching the first dielectric layer to remove the first dielectric layer from the first location and keep the second layer at the second location;

c) depositing a second layer of the first dielectric material or of the first dielectric materials on the first interface layer at the first location and on the first dielectric layer at the second location; and d) forming the third portion on the second layer at the first location.

According to an embodiment, step d) comprises the steps of:

depositing a third dielectric layer of the second dielectric material on the second layer; and etching the third dielectric layer to reach the second dielectric layer at the second location.

According to an embodiment, the etching of the third dielectric layer comprises a chem.-mech. planarization step.

The foregoing and other features and advantages will be discussed in detail in the following non-limiting description of specific embodiments in connection with the accompanying drawings.

DETAILED DESCRIPTION

Figure 1:
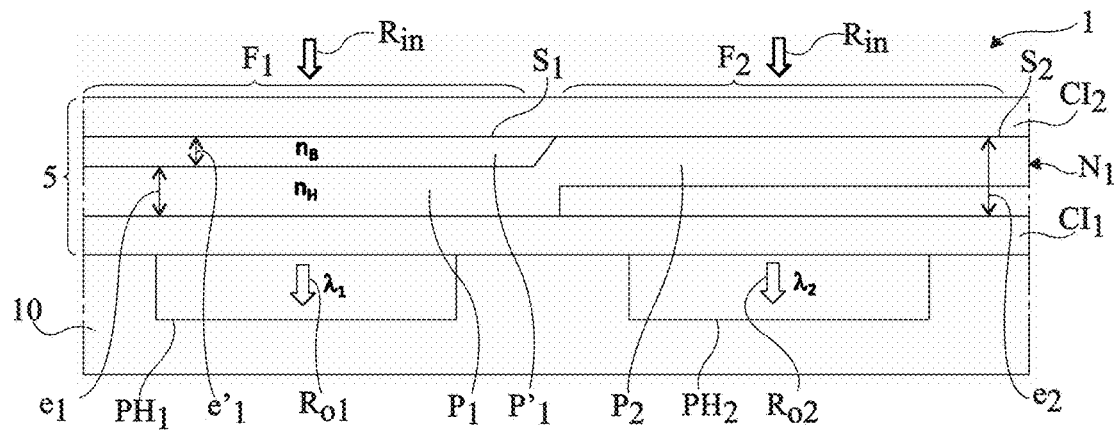
FIGS. 1 and 2 are partial simplified cross-section views of embodiments of an interference filter.

For clarity, the same elements have been designated with the same reference numerals in the various drawings and, further, as usual in the representation of electronic circuits, the various drawings are not to scale. Further, only those elements which are useful to the understanding of the present description have been shown and will be described. In particular, the means for processing the signals supplied by the sensors described hereafter are within the abilities of those skilled in the art and are not described. The terms "approximately", "substantially", and "in the order of" are used herein to designate a tolerance of plus or minus 10% of the value in question. Further, in the following description, "lateral size" or "dimension" of a sensor element designates the maximum dimension of this element in a plane perpendicular to the stacking direction of the layers forming the sensor.

In the following description, the refraction index of the material designates the refraction index of the material over the operating range of the interference filter, considering that the refraction index of the material is substantially constant over the operating wavelength range of the interference filter, or the average refraction index of the material over the operating range of the interference filter in the case where the refraction index of the material varies over the operating wavelength range of the interference filter.

FIG. 1 shows an embodiment of an optoelectronic circuit 1 comprising an interference filter 5 resting on a support 10. Support 10 may correspond to an image sensor comprising, for example, two photodetectors $PH_1$ and $PH_2$. In the present embodiment, filter 5 comprises two filter pixels $F_1$ and $F_2$, filter pixel $F_1$ covering photodetector $PH_1$ and filter pixel $F_2$ covering photodetector $PH_2$. Further, in the present embodiment, filter 5 comprises a filtering level $N_1$. Filtering level $N_1$ comprises, from bottom to top in FIG. 1:

a first interface layer $CI_1$;

portions $P_1$ and $P_2$ of a first dielectric material having a high refraction index $n_H$, resting on interface layer $CI_1$, preferably in contact with interface layer $CI_1$, portion $P_1$ having a thickness $e_1$ and being located at the level of filter pixel $F_1$ and portion $P_2$ having a thickness $e_2$, greater than thickness $e_1$, and being located at the level of filter pixel $F_2$, portion $P_2$ delimiting a substantially planar surface $S_2$, opposite to interface layer $CI_1$;

a portion $P'_1$ having a thickness $e'_1$ of a second dielectric material, having a low refraction index $n_B$, smaller than refraction index $n_H$, resting on portion $P_1$, preferably in contact with portion $P_1$, and delimiting a substantially planar surface $S_1$, opposite to reflective layer $CI_1$ substantially coplanar with surface $S_2$; and a second interface layer $CI_2$ resting on portions $P'_1$ and $P_2$, preferably in contact with portions $P'_1$ and $P_2$.

The first dielectric material is further preferably transparent, that is, with an extinction coefficient smaller than $5 \cdot 10^{-3}$, in the operating range of filter pixels $F_1$ and $F_2$. The second dielectric material is further preferably transparent, that is, with an extinction coefficient smaller than $5 \cdot 10^{-3}$, in the operating range of filter pixels $F_1$ and $F_2$.

Each interface layer $CI_1$ and $CI_2$ may correspond to a single layer (made of a dielectric material or metallic) or to a stack of two layers or of more than two layers (made of dielectric materials).

The assembly comprising the stack of the portion of interface layer $CI_1$ under portion $P_1$ of the first dielectric material, of portion $P_1$ of the first dielectric material, of portion $P'_1$ of the second dielectric material, and of the portion of interface layer $CI_2$ on portion $P'_1$ of the second dielectric material forms filter pixel $F_1$. The assembly comprising the stack of the portion of interface layer $CI_1$ under portion $P_2$ of the first dielectric material, of portion $P_2$ of the first dielectric material, and of the portion of interface layer $CI_2$ resting on portion $P_2$ of the second dielectric material forms filter pixel $F_2$.

Filter 5 receives an incident radiation $R_{in}$. Filter 5 supplies support 10 with a first radiation $R_{o1}$ at photodetector $PH_1$ which correspond to the portion of incident radiation $R_{in}$ filtered by filter pixel $F_1$. Filter 5 supplies support 10 with a second radiation $R_{o2}$ at photodetector $PH_2$ which correspond to the portion of incident radiation $R_{in}$ filtered by filter pixel $F_2$.

Figure 2:
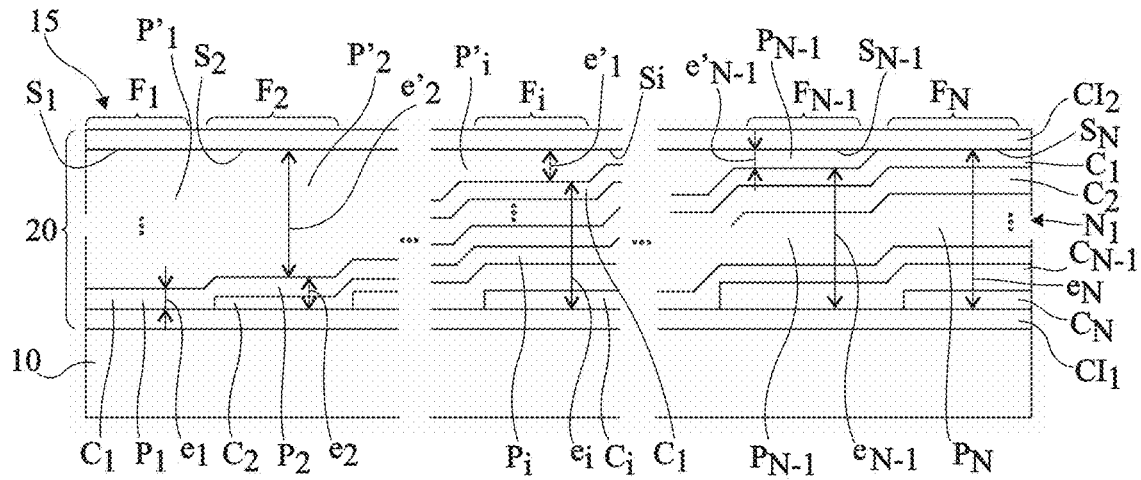

FIG. 2 shows another embodiment of an optoelectronic circuit 15 comprising an interference filter 20 which corresponds to a generalization of interference filter 5 to more than two filter pixels. In the present embodiment, filtering level $N_1$ comprises N filter pixels $F_1$ to $F_N$, where N is an integer varying from 2 to 20.

Each filter pixel $F_i$, with i varying from 1 to N–1, comprises a stack, sandwiched between interface layers $CI_1$ and $CI_2$, of a portion $P_i$ of thickness $e_i$ of the first dielectric material covered with a portion $P'_i$ of thickness $e'_i$ of the second dielectric material, portion $P'_i$ delimiting a surface $S_i$ in contact with interface layer $CI_2$. Filter pixel $F_N$ comprises only one portion $P_N$ of the first dielectric material sandwiched between interface layers $CI_1$ and $CI_2$, portion $P_N$ delimiting a surface $S_N$ in contact with interface layer $CI_2$. For i varying from 1 to N–2, thickness $e_{i+1}$ is greater than thickness $e_i$ and thickness $e'_{i+1}$ is smaller than thickness $e'_i$. For i varying from 1 to N–1, the sum of thicknesses $e_i$ and $e'_i$ is equal to thickness $e_N$. Thereby, surfaces $S_1$ to $S_N$ are substantially coplanar.

According to an embodiment, each portion $P_i$ is formed by the stacking of layers $C_1$ to $C_i$ of the first dielectric material. According to an embodiment, layer $C_1$ extends over all the filter pixels $F_1$ to $F_N$ and layer $C_N$ only extends over filter pixel $F_N$. Layer $C_i$ extends over filter pixels $F_i$ to $F_N$ and does not extend over filter pixels $F_1$ to $F_{N-i}$. As a variation, layers $C_1$ to $C_i$ may not all be made of the same first dielectric material. They are however all made of a dielectric material having a refraction index greater than refraction index $n_B$.

In the previously described embodiments, the interference filter comprises a single filtering level $N_1$. However, the interference filter may comprise a stack of two filtering levels or a stack of more than two filtering levels, where each filtering level may have the structure previously described in relation with FIG. 2, and an interface layer may be common to two successive filter levels.

The inventors have shown that it is possible to obtain a pixelated filter 20 comprising filter pixels corresponding to bandpass filters capable of generally filtering a radiation between two wavelengths $\lambda_1$ and $\lambda_2$, when the interval between refraction index $n_H$ at wavelength $\lambda_2$ and low refraction index $n_B$ at wavelength $\lambda_1$ is greater than a given threshold. In particular, when interface layers $CI_1$, $CI_2$ are semi-reflective metal layers, the inventors have shown that it is possible to obtain a pixelated filter 20 comprising filter pixels corresponding to bandpass filters capable of generally filtering a radiation between two wavelengths $\lambda_1$ and $\lambda_2$, when refraction index $n_H$ at wavelength $\lambda_2$ and low refraction index $n_B$ at wavelength $\lambda_1$ verify the following relation:

$$n_H(\lambda_2)/n_B(\lambda_1) \geq \lambda_2/\lambda_1$$

According to an embodiment, first and second interface layers $CI_1$, $CI_2$ are semi-reflective layers, for example, metal layers, particularly made of silver (Ag), possibly doped to improve the mechanical strength or decrease aging effects. In particular, in the case of a use of the interference filter for a color sensor or a color and infrared sensor, interface layers $CI_1$, $CI_2$ are preferably semi-reflective metal layers.

According to an embodiment, each interface layer $CI_1$, $CI_2$ comprises at least two dielectric layers having different refraction indexes with an index contrast of at least 0.5.

Refraction index $n_H$ may be in the range from 1.8 to 3.8. Refraction index $n_B$ may be in the range from 1.3 to 2.5.

The first dielectric material may be selected from the group comprising silicon nitride (SiN), amorphous silicon (aSi), hafnium oxide ($HfO_x$), aluminum oxide ($AlO_x$), a film made up of aluminum, oxygen, and nitrogen ($AlO_xN_y$), a film made up of silicon, oxygen, carbon, and nitrogen ($SiO_xC_yN_z$), silicon nitride ($SiN_x$), niobium oxide ($NbO_x$), tantalum oxide ($TaO_x$), titanium oxide ($TiO_x$), hydrogenated amorphous silicon (aSiH), and mixtures of at least two of these compounds. Each layer $C_1$ may have a thickness in the range from 5 nm to 100 nm. Thickness $e_N$ may be in the range from 50 nm to 150 nm.

The second dielectric material may be selected from the group comprising silicon dioxide ($SiO_2$), magnesium fluoride ($MgF_2$), silicon oxide ($SiO_x$), silicon oxynitride ($SiO_xN_y$), hafnium oxide ($HfO_x$), aluminum oxide ($AlO_x$), a film made up of aluminum, oxygen, and nitrogen ($AlO_xN_y$), a film made up of silicon, oxygen, carbon, and nitrogen ($SiO_xC_yN_z$), silicon nitride ($SiN_x$), and mixtures of at least two of these compounds. Thickness $e'_1$ may be in the range from 50 nm to 150 nm.

FIGS. 3A to 3G are partial simplified cross-section views of structures obtained at successive steps of another embodiment of interference filter 5 of FIG. 1.

Figure 3A:
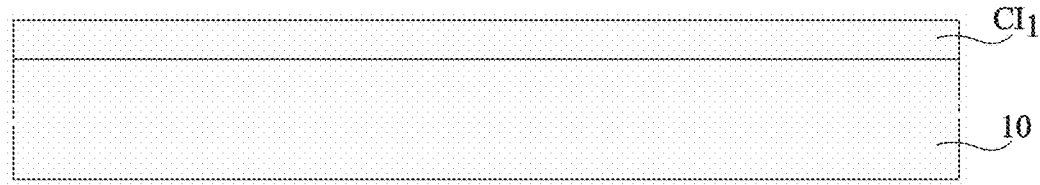
FIGS. 3A to 3G are partial simplified cross-section views of structures obtained at successive steps of the embodiment of a method of manufacturing the interference filter of FIG. 1.
Figure 3B:
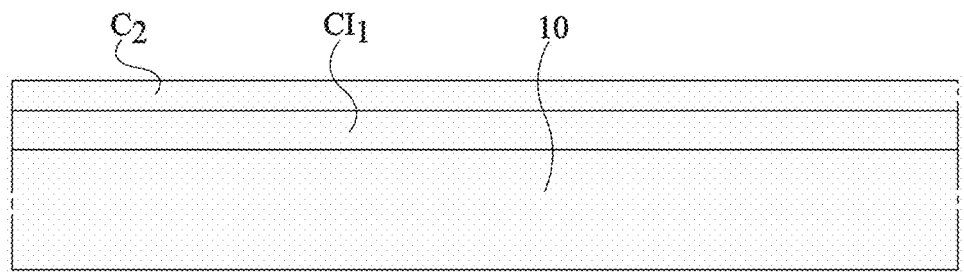
Figure 3C:
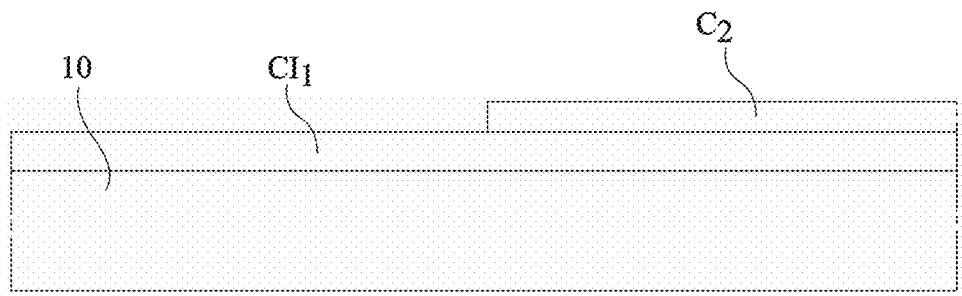
Figure 3D:
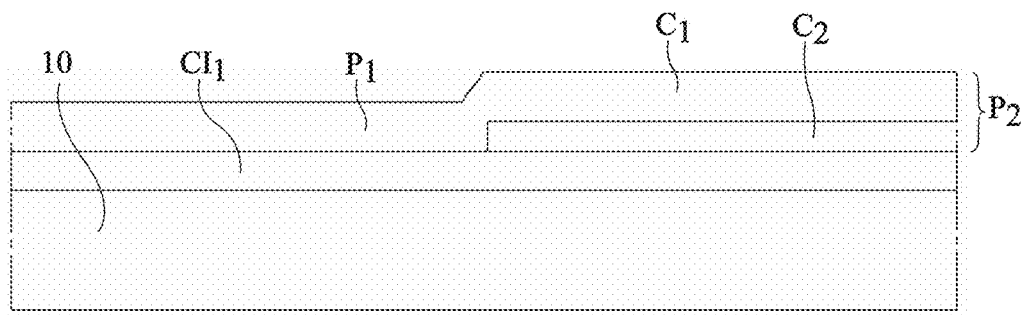
Figure 3E:
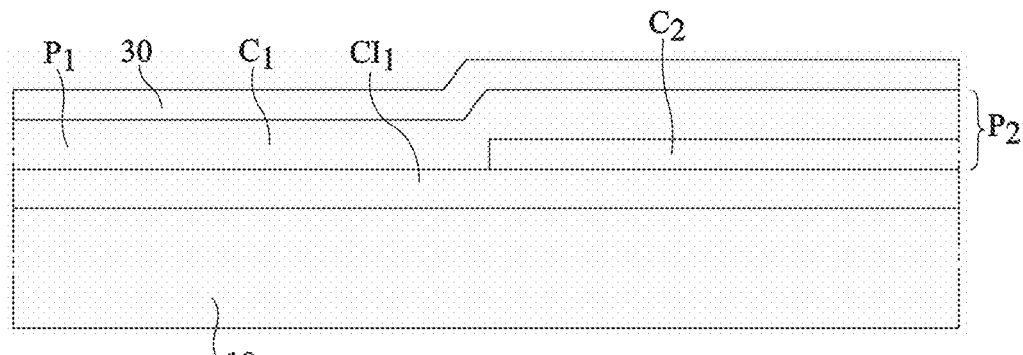
Figure 3F:
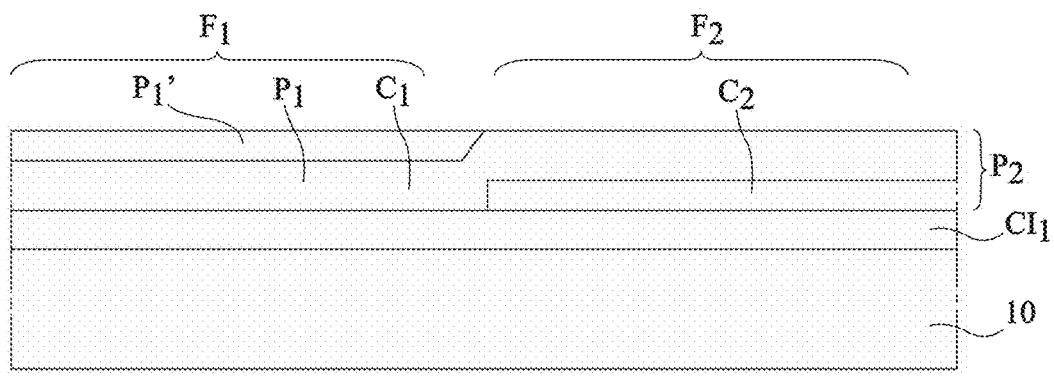
Figure 3G:
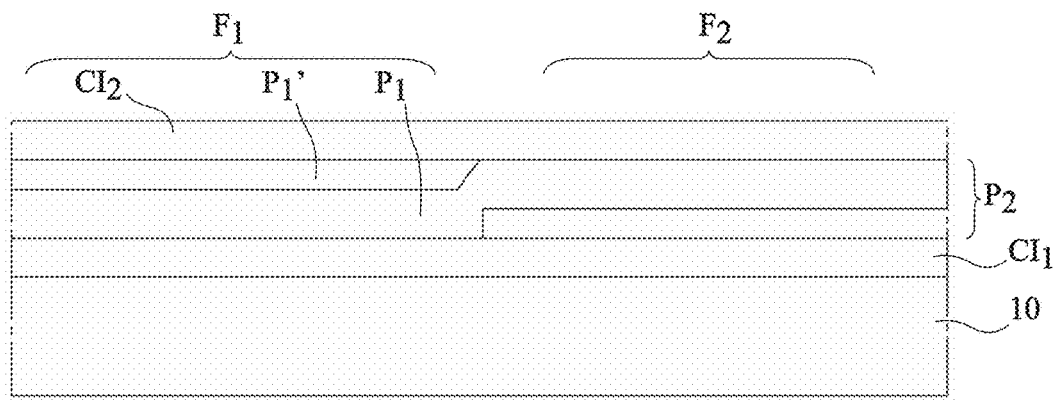

In this embodiment, the method comprises the successive steps of:
   forming interface layer $CI_1$ on support 10 (FIG. 3A);
   forming layer $C_2$ of thickness $e_2-e_1$ of the first dielectric material on first interface layer $CI_1$ (FIG. 3B);
   etching layer $C_2$, with an etch stop on interface layer $CI_1$ at the location of the first filter pixel $F_1$ to only keep layer $C_2$ at the location of second filter pixel $F_2$ (FIG. 3C);
   forming layer $C_1$ of thickness $e_1$ of the first dielectric material on first interface layer $CI_1$ and on layer $C_2$ (FIG. 3D). Thus, portion $P_1$ of the first dielectric material is obtained at the location of first filter pixel $F_1$ and portion $P_2$ of the second dielectric material is obtained at the location of second filter pixel $F_2$;
   forming a layer 30 of thickness $e'_1$ of the second dielectric material on layer $C_1$ (FIG. 3E);
   etching layer 30, with an etch stop on the portion of layer $C_1$ located at the location of second filter pixel $F_2$, which delimits portion $P'_1$ of the second dielectric material at the location of first filter pixel $F_1$ (FIG. 3F); and
   forming interface layer $CI_2$ on portion $P'_1$ of the second dielectric material and portion $P_2$ of the first dielectric material (FIG. 3G).

As a variation, an additional layer, not shown in the drawings, of a dielectric or metallic material, covering interface layer $CI_1$ and for example playing the role of an oxidation protection layer and/or of a layer improving the bonding of the following depositions, may be provided. This layer is then used as an etch stop layer during the etching of layer $C_2$. As a variation, the forming of interface layer $CI_2$ may be preceded by the forming of an additional layer, not shown in the drawings, of a dielectric or metallic material, for example playing the role of a layer improving the bonding of interface layer $CI_2$.

Generally, in the case of interference filter 20 comprising N filter pixels $F_1$ to $F_N$, an embodiment of a method of manufacturing interference filter 20 comprises the steps of:
   1) forming interface layer $CI_1$ on support 10;
   Repeating, for i decreasing from N to 2, steps 2) and 3) of:
   2) forming layer $C_i$ of thickness $e_i-e_{i-1}$ of the first dielectric material over the entire structure;
   3) etching layer $C_i$ formed at step 2), with an etch stop on interface layer $CI_1$ at the location of filter pixels $F_1$ to $F_{i-1}$ to leave layer $C_i$ formed at step 2) at the locations of filter pixels $F_i$ to $F_N$;
   4) forming a layer of thickness $e'_1$ of the second dielectric material on the structure obtained after the repeating of steps 2) and 3);
   5) etching the layer of the second dielectric material, with an etch stop on the first dielectric material at the location of filter pixel $F_N$ to delimit portions $P'_1$ to $P'_{N-1}$ of the second dielectric material at the location of filter pixels $F_1$ to $F_{N-1}$; and
   6) forming interface layer $CI_2$ on the structure obtained at step 5).

According to an embodiment, the etch step of step 5) may be a chem.-mech. planarization (CMP), in which case layer 30 is preferably deposited with a thickness of at least twice $e'_1$. According to another embodiment, previously-described steps 5) and 6) are replaced with a step of depositing a polymer dielectric material at the location of filter pixels $F_1$ to $F_{N-1}$. In this case, the chem.-mech. planarization step may be omitted.

Advantageously, the spacers of interference filter 20 have lateral dimensions preferably smaller than 50 nm. This enables to decrease the part of light which reaches the spacers and thus to decrease signal losses by scattering and/or a distortion of the spectral responses of the filter pixels.

The pixelated filter according to the previously-described embodiments may be used in an image sensor.

The image sensor may then comprise photon sensors or photodetectors capable of detecting radiations in different wavelength ranges or capable of detecting radiations in the same wavelength range. In this last case, only the presence of the filter pixels enables to detect radiations in different wavelength ranges. Each filter pixel can then cover at least one photodetector of the sensor and play the role of a bandpass filter for the incident radiation which reaches the sensor to supply a radiation adapted to the range of wavelengths detected by the associated photodetector. The lateral dimensions of the filter pixels may be equal to the lateral dimensions of the photosites of the image sensor or equal to a multiple of the lateral dimensions of the photosites of the image sensor. The layout of the filter pixels may follow that of the photosites of the image sensor. As an example, the filter pixels may be arranged in a Bayer array. The decreased dimensions of the spacers of interference filter 20 particularly enable to use interference filter 20 with image sensors having photosites of a size smaller than 1.5 µm. The image sensor may be a color sensor or a color and infrared sensor.

The inventors have shown that the pixelated filter according to the previously-described embodiments surprisingly enables to perform a filtering in a wavelength range as extended as that necessary for a color sensor or a color and infrared sensor. Indeed, the presence of portions P'$_i$ increases the optical path of all the filter pixels except for pixel F$_N$. To keep the same wavelengths filtered by the filter pixels as for a conventional pixelated filter, it is sufficient to keep the same optical path in each filter pixel as for a conventional pixelated filter. However, a simplified calculation would show, for example, considering the refraction index of silicon nitride for high refraction index n$_H$ and the refraction index of silicon dioxide for low refraction index n$_B$, that the accessible wavelength range would only range from blue to green. The inventors have shown that portions P'$_i$ of low refraction index n$_B$ would cause a phase shift favorable to the reflection on the semi-reflective interface layers and that a wavelength range from 450 nm to 600 nm is accessible when the interval between high refraction index n$_H$ and low refraction index n$_B$ is greater than or equal to 0.5. The addition in at least one filter pixel of an additional dielectric material having a refraction index greater than high refraction index n$_H$ enables to further increase the accessible wavelength range up to infrared, particularly up to the 900-nm wavelength.

The sensor may be capable of detecting an image over a given wavelength range, for example, in the infrared range. The pixelated filter according to the previously-described embodiments can then be used to compensate for the variations of the inclination of the radiation which reaches the sensor. Each filter pixel is then located at a location which depends on the inclination of the radiation received by the sensor. Each filter pixel may then play the role of a bandpass filter for the radiation with a given inclination substantially centered on the same wavelength.

FIGS. 4 to 7 show embodiments of image sensors comprising an interference filter according to the previously-described embodiments.

In the embodiments shown in FIGS. 4 to 7, support 10 corresponds to an integrated circuit comprising a substrate 42 having photon sensors formed inside and/or on top thereof, three photon sensors PH$_1$, PH$_2$, PH$_3$ being shown in FIGS. 4 to 7. Support 10 further comprises a stack 44 of electrically-insulating layers covering substrate 42 where electrically-conductive elements 46, which enable, in particular, to electrically connect the photon sensors, are formed. In the embodiments shown in FIGS. 4 to 7, interference filter 20 comprises, as an example, three filter pixels F$_1$, F$_2$ and F$_3$ and a single filter level N$_1$. Further, the image sensors comprise lenses 48, for example, one lens 48 for each photon sensor PH$_1$, PH$_2$, PH$_3$.

Figure 4:
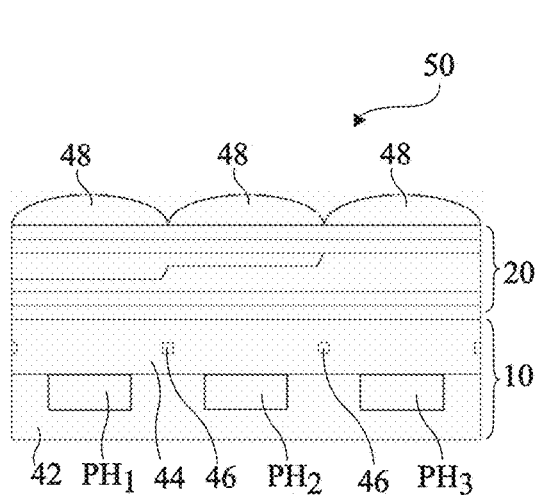
FIGS. 4 to 7 are partial simplified cross-section views of embodiments of an image sensor comprising an interference filter.

FIG. 4 shows an embodiment of an image sensor 50 having interference filter 20 arranged therein on the side of stack 44 opposite to substrate 42. This type of layout is called front surface assembly, since the incident radiation reaches sensors PH$_1$, PH$_2$, PH$_3$ on the side of stack 44. In FIG. 4, interference filter 20 is directly attached to stack 44, for example, via a gluing material or, preferably, by being directly deposited on stack 44. In this embodiment, lenses 48 rest on interference filter 20, on the side of interference filter 20 opposite to support 10.

Figure 5:
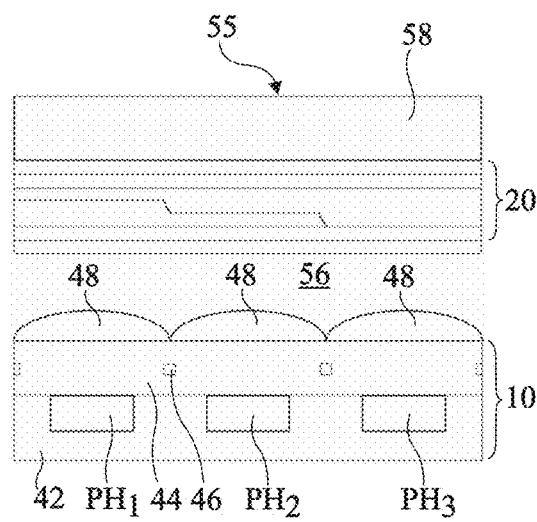

FIG. 5 shows an embodiment of an image sensor 55 where interference filter 20 is arranged on the front surface and where lenses 48 are arranged between support 10 and interference filter 20 and rest on stack 44. An air film 56 is provided between lenses 48 and interference filter 20. The method of manufacturing image sensor 55 may comprise forming interference filter 20 on a substrate 58 substantially transparent to the incident radiation and attaching, for example, by gluing, interference filter 20 to stack 44, air film 56 being maintained, for example, by use of a spacer, not shown, interposed between stack 44 and filter 20, at the periphery of stack 44. According to a variation, not shown, spacer 20 is deposited above lenses 48 with no air film, in which case it is necessary to previously planarize lenses 48 by deposition of a layer having a very low refraction index, for example, made of a polymer having a refraction index 1.2.

Figure 6:
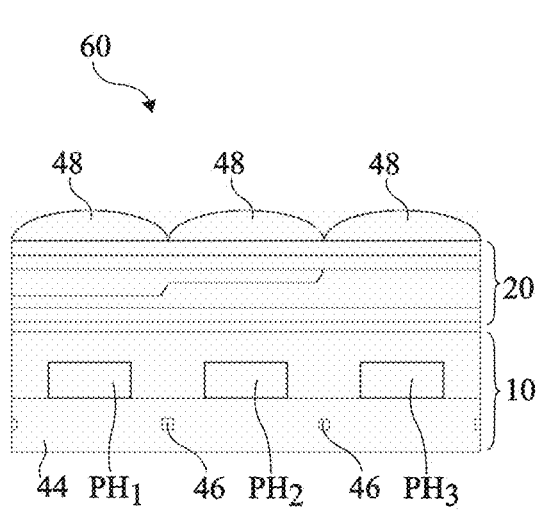

FIG. 6 shows an embodiment of an image sensor 60 where interference filter 20 is arranged on the side of substrate 42. This type of layout is called back side assembly, since the incident radiation reaches sensors PH$_1$, PH$_2$, PH$_3$ on the side of substrate 42. In FIG. 6, interference filter 20 is directly attached to substrate 42, possibly via a gluing material. In the present embodiment, lenses 48 rest on interference filter 20, on the side of interference filter 20 opposite to support 10.

Figure 7:
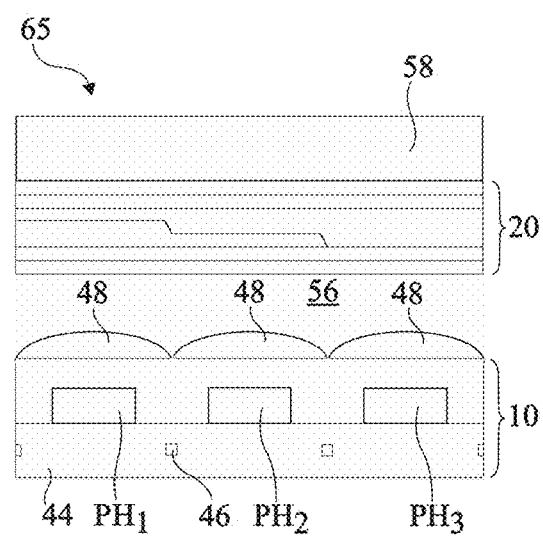

FIG. 7 shows an embodiment of an image sensor 65 where interference filter 20 is arranged on the back side and where lenses 48 are arranged between support 10 and interference filter 20 and rest on substrate 42. As for image sensor 55, an air film 66 is provided between lenses 48 and interference filter 20. The method of manufacturing image sensor 65 may be similar to what has been described for image sensor 55.

In the previously-described embodiments, the image sensor may comprise an antireflection layer, not shown.

In the embodiments previously described in relation with FIGS. 5 and 7, the use of interference filter 20 is particularly advantageous since, in these embodiments, the incident radiation which reaches interference filter 20 has not been focused yet by lenses 48 and necessarily crosses the spacers between the filter pixels. The decreased dimensions of these spacers improve the sensor operation.

Figure 8:
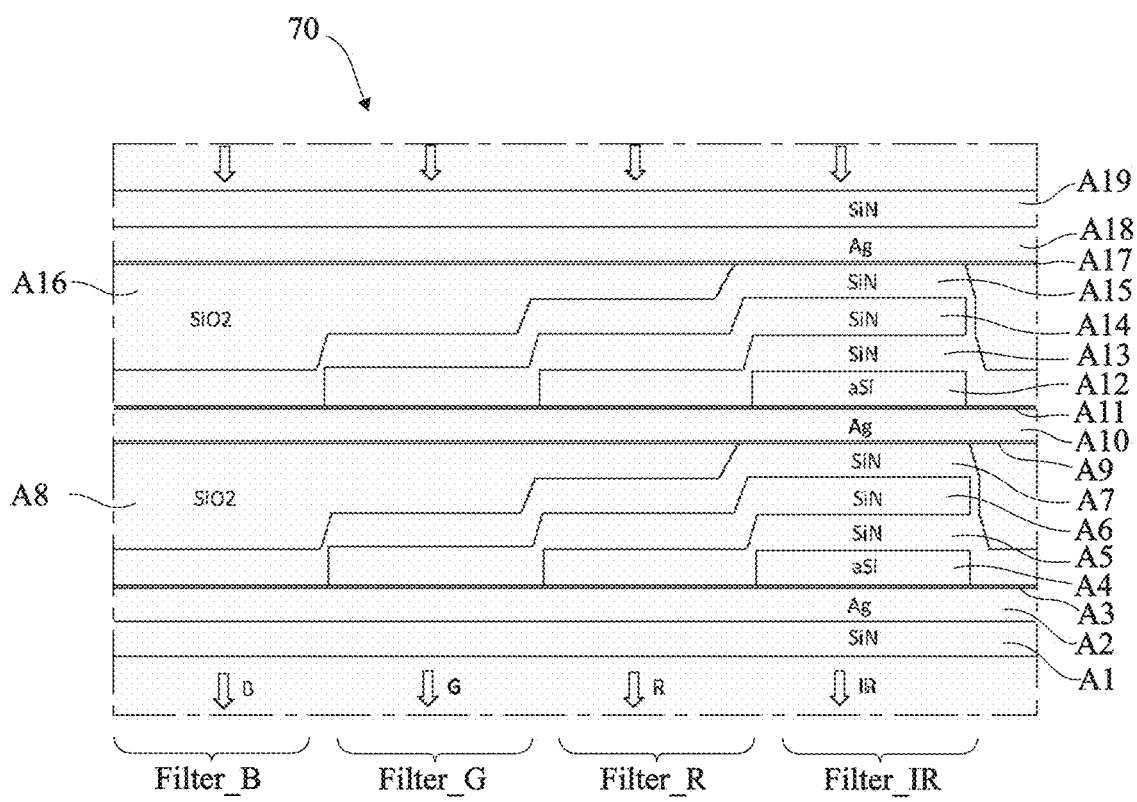
FIG. 8 is a partial simplified cross-section view of an embodiment of an interference filter for a color and infrared image sensor.

FIG. 8 shows an embodiment of an interference filter 70 having had its spectral response determined by simulation. Interference filter 70 has two filtering levels N$_1$ and N$_2$, each filtering level comprising four filter pixels Filter_B, Filter_G, Filter_R, and Filter_IR respectively corresponding to a filter only letting through blue light B, to a filter only letting through green light G, to a filter only letting through red light R, and to a filter only letting through infrared radiation IR substantially centered on the 800-nm wavelength.

The thicknesses and the materials forming the layers of interference filter 70 are gathered in table I hereafter according to filter pixels Filter_B, Filter_G, Filter_R and Filter_IR. In the rest of the description, a layer is indicated as having a zero thickness for a given filter pixel if it is not present for the filter pixel.

TABLE I

| Layer Nr. | Material | Filter_B | Filter_G Thickness (nm) | Filter_R | Filter_IR |
|---|---|---|---|---|---|
| A1 | SiN | | 42 | | |
| A2 | Ag | | 22 | | |
| A3 | TiO$_2$ | | 5 | | |
| A4 | aSi | 0 | 0 | 0 | 25 |
| A5 | SiN | 0 | 0 | 33 | 33 |
| A6 | SiN | 0 | 32 | 32 | 32 |
| A7 | SiN | 6 | 6 | 6 | 6 |
| A8 | SiO$_2$ | 91 | 59 | 25 | 0 |
| A9 | SiN | | 5 | | |
| A10 | Ag | | 33 | | |
| A11 | TiO$_2$ | | 5 | | |
| A12 | aSi | 0 | 0 | 0 | 25 |
| A13 | SiN | 0 | 0 | 33 | 33 |
| A14 | SiN | 0 | 32 | 32 | 32 |
| A15 | SiN | 6 | 6 | 6 | 6 |
| A16 | SiO$_2$ | 91 | 59 | 25 | 0 |
| A17 | SiN | | 5 | | |
| A18 | Ag | | 16 | | |
| A19 | SiN | | 46 | | |

Filter 70 has been manufactured by successively depositing each layer A1 to A19 and by etching layers A4 to A6 and A12 to A14 at the locations where they are not present and by providing a planarization step after the deposition of layers A8 and A16 all the way to the underlying layers.

TiO$_2$ layers A3 and A11 are used both as an encapsulation for underlying Ag layer A2 and A10 and as an etch stop layer on etching of the subsequent aSi and SiN layers. The refraction index of SiN over the wavelength range from 450 nm to 600 nm is substantially constant and equal to 2.0 and the refraction index of SiO$_2$ over the wavelength range from 450 nm to 600 nm is substantially constant and equal to 1.46. The refraction index of amorphous silicon (aSi) over the infrared wavelength range is substantially constant and equal to 3.7. The total thickness of filter 70 is 0.37 μm. The thickness of filter 70 being low as compared with the pixel size, the optical crosstalk phenomenon is little marked.

Figure 9:
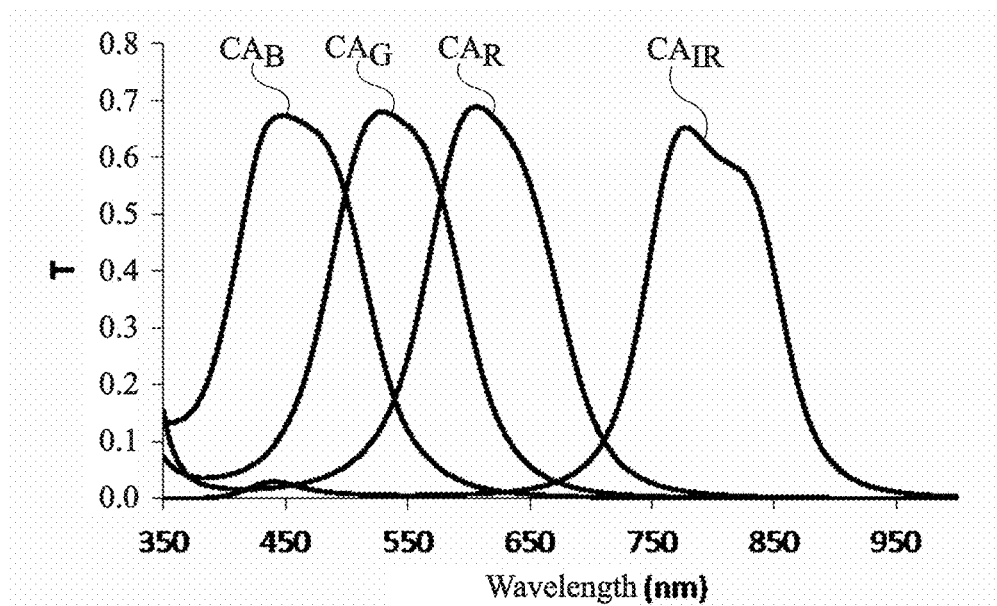
FIG. 9 shows transmission curves of filter pixels of the filter of FIG. 8.

FIG. 9 shows curves of the variation of the transmission respectively of filter pixel Filter_B (curve $CA_B$), of filter pixel Filter_G (curve $CA_G$), of filter pixel Filter_R (curve $CA_R$), and of filter pixel Filter_IR (curve $CA_R$) for interference filter 70.

Figure 10:
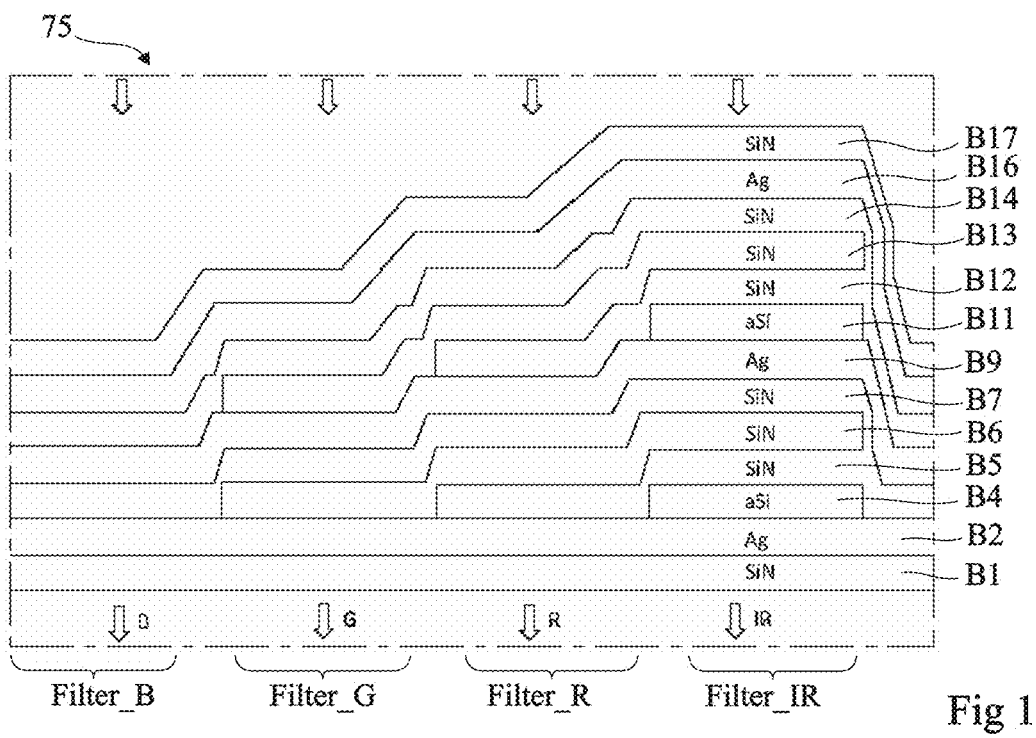
FIGS. 10 and 11 are drawings similar to FIGS. 8 and 9 of an example of comparison of an interference filter for a color and infrared image sensor.

FIG. 10 shows an example of comparison of an interference filter 75 having had its spectral response determined by simulation. Interference filter 75 has the same structure as filter 70, with the difference that SiO$_2$ layers A8 and A16 are not present and that the thicknesses of the other layers may be modified.

The thicknesses and the materials forming the layers of interference filter 75 are gathered in table II hereafter according to filter pixels Filter_B, Filter_G, Filter_R, and Filter_IR.

TABLE II

| Layer Nr. | Material | Filter_B | Filter_G Thickness (nm) | Filter_R | Filter_IR |
|---|---|---|---|---|---|
| B1 | SiN | | 41 | | |
| B2 | Ag | | 22 | | |
| B3 | TiO$_2$ | | 5 | | |
| B4 | aSi | 0 | 0 | 0 | 19 |
| B5 | SiN | 0 | 0 | 20 | 20 |
| B6 | SiN | 0 | 24 | 24 | 24 |
| B7 | SiN | 48 | 48 | 48 | 48 |
| B8 | SiN | | 5 | | |
| B9 | Ag | | 33 | | |

TABLE II-continued

| Layer Nr. | Material | Filter_B | Filter_G Thickness (nm) | Filter_R | Filter_IR |
|---|---|---|---|---|---|
| B10 | TiO$_2$ | | 5 | | |
| B11 | aSi | 0 | 0 | 0 | 20 |
| B12 | SiN | 0 | 0 | 21 | 21 |
| B13 | SiN | 0 | 26 | 26 | 26 |
| B14 | SiN | 47 | 47 | 47 | 47 |
| B15 | SiN | | 5 | | |
| B16 | Ag | | 17 | | |
| B17 | SiN | | 70 | | |

Filter 75 has been manufactured by successively depositing each layer A1 to A19 and by etching layers B4 to B6 and B11 to B13 at the locations where they are not present.

Figure 11:
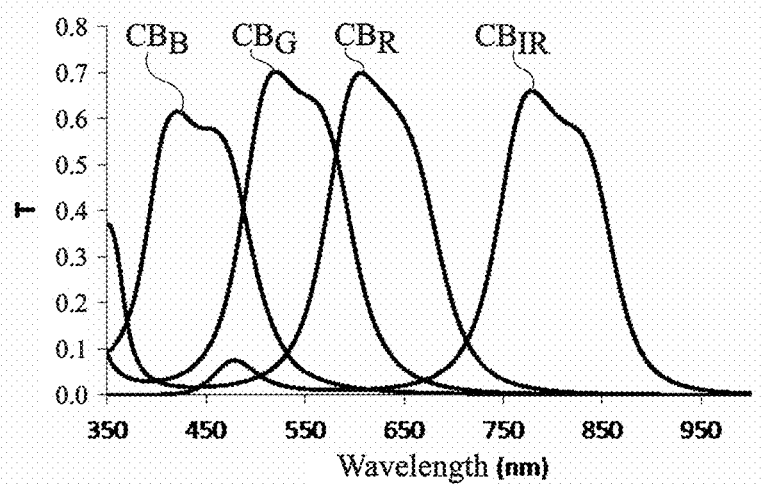

FIG. 11 shows curves of the variation of the transmission respectively of filter pixel Filter_B (curve $CB_B$), of filter pixel Filter_G (curve $CB_G$), of filter pixel Filter_R (curve $CB_R$), and of filter pixel Filter_IR (curve $CB_R$) for interference filter 75. The transmission curves of 70 are substantially identical to the transmission curves of filter 75. The spectral responses of filters 70 and 75 are thus substantially identical. However, the maximum lateral dimension of the spacers of filter 75 is greater than that of the spacers of filter 70. Indeed, between filter pixels Filter_IR and Filter_R, the maximum lateral dimension of the spacers of filter 75 is for example in the order of 250 nm while it is in the order of 50 nm for filter 70.

Filter 70 is thus particularly adapted to a use with an image sensor having a photosite size smaller than one micrometer.

It is possible to center filter pixel Filter_IR on a wavelength greater than that of previously-described filter 70, for example, by introducing an aSi layer in filter pixel Filter_R. The replacing of a SiN layer with an aSi layer of higher refraction index in filter pixel Filter_R enables to decrease the thickness of the step between filter pixel Filter_G and filter pixel Filter_R, and the thickness difference may be used to shift filter pixel Filter_IR towards high wavelengths. However, since the total thickness of each filter pixel should be maintained identical to that of filter pixel Filter_B, the thickness of filter pixel Filter_IR cannot be indefinitely increased.

The spectral response of such an interference filter has been determined by simulation with aSi in filter pixels Filter_IR and Filter_R. The filter stack has a total thickness of 0.39 μm, the step heights between filter pixel Filter_B and filter pixel Filter_G, between filter pixel Filter_G and filter pixel Filter_R, and between filter pixel Filter_R and filter pixel Filter_IR are respectively 38 nm, 8 nm, and 38 nm. The maximum width of the spacers is for example in the order of 60 nm at the transitions between filter pixel Filter_R and filter pixel Filter_IR.

The thicknesses and the materials forming the layers of the interference filter are gathered in table III hereafter according to filter pixels Filter_B, Filter_G, Filter_R and Filter_IR.

TABLE III

| Layer Nr. | Material | Filter_B | Filtre G Thickness (nm) | Filtre R | Filtre IR |
|---|---|---|---|---|---|
| C1 | SiN | | 75 | | |
| C2 | Ag | | 18 | | |
| C3 | TiO$_2$ | | 5 | | |
| C4 | aSi | 0 | 0 | 0 | 38 |

TABLE III-continued

| Layer Nr. | Material | Filter_B | Filtre G | Filtre R | Filtre IR |
|---|---|---|---|---|---|
| | | | Thickness (nm) | | |
| C5 | aSi | 0 | 0 | 8 | 8 |
| C6 | SiN | 0 | 38 | 38 | 38 |
| C7 | SiN | 5 | 5 | 5 | 5 |
| C8 | SiO$_2$ | 85 | 47 | 38 | 0 |
| C9 | SiN | | | | 5 |
| C10 | Ag | | | | 31 |
| C11 | TiO$_2$ | | | | 5 |
| C12 | aSi | 0 | 0 | 0 | 38 |
| C13 | aSi | 0 | 0 | 8 | 8 |
| C14 | SiN | 0 | 38 | 38 | 38 |
| C15 | SiN | 5 | 5 | 5 | 5 |
| C16 | SiO$_2$ | 85 | 47 | 38 | 0 |
| C17 | SiN | | | | 5 |
| C18 | Ag | | | | 16 |
| C19 | SiN | | | | 47 |

Figure 12:
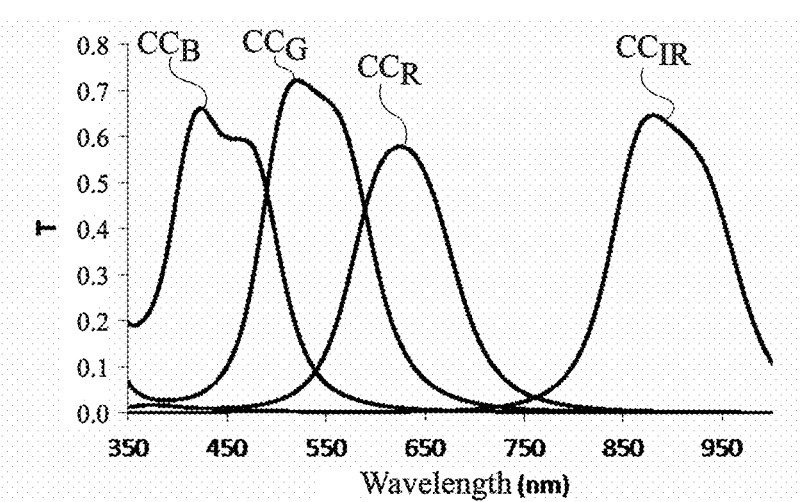
FIG. 12 shows transmission curves of four pixels of another embodiment of a filter for a color and infrared image sensor.

FIG. 12 shows curves of the variation of the transmission respectively of filter pixel Filter_B (curve $CC_B$), of filter Filter_G (curve $CC_G$), of filter Filter_R (curve $CC_R$), and of filter Filter_IR (curve $CC_{IR}$) for the interference filter defined by table III. A filter pixel Filter_IR centered on a wavelength of approximately 900 nm has been obtained.

Figure 13:
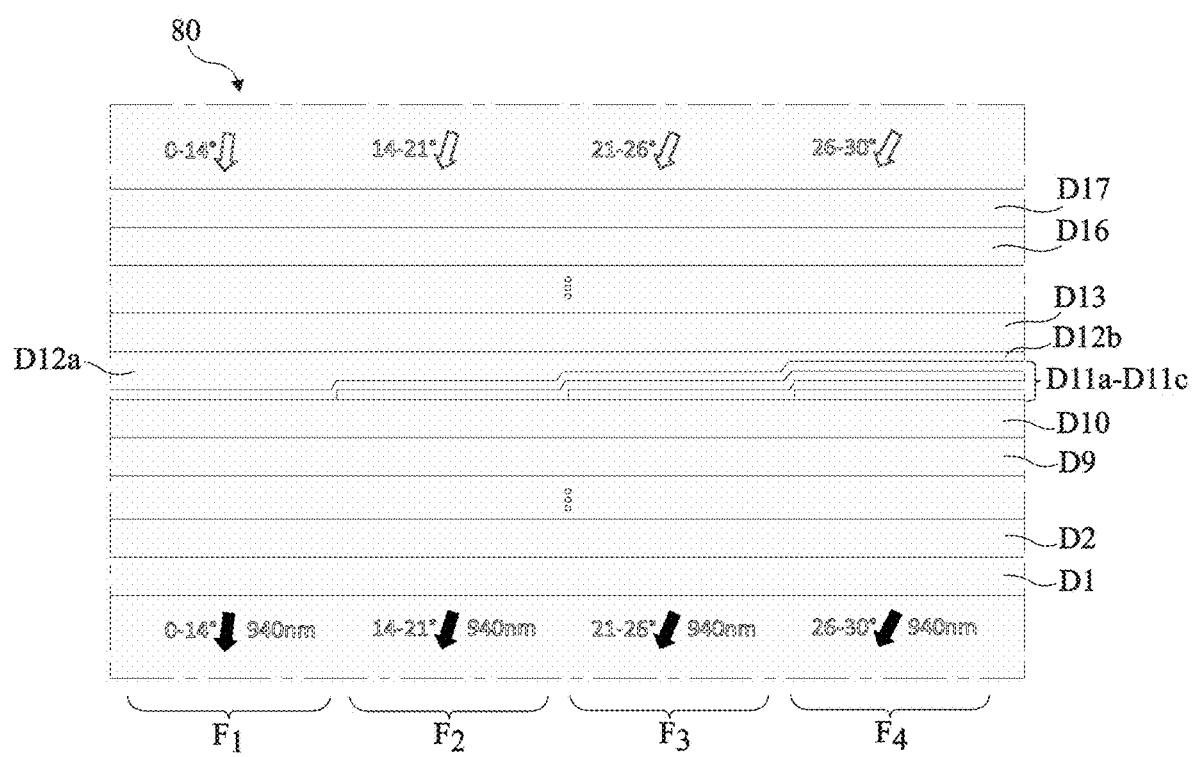
FIG. 13 is a partial simplified cross-section view of an embodiment of an interference filter for a tilt compensation infrared sensor.

FIG. 13 shows an embodiment of an interference filter 80 compensating the wavelength shift under a spatially variable incidence having had its spectral response determined by simulation. Interference filter 80 comprises four filter pixels $F_1$, $F_2$, $F_3$ and $F_4$. Filter pixels $F_1$, $F_2$, $F_3$ and $F_4$ are intended to receive a radiation having an incidence respectively in the range from 0° to 14°, from 14° to 21°, from 21° to 26°, and from 26° to 30°.

The thicknesses and the materials forming the layers of interference filter 80 are gathered in table IV hereafter according to the filter pixels.

TABLE IV

| Layer Nr. | Material | Filter_B | Filtre G | Filtre R | Filtre IR |
|---|---|---|---|---|---|
| | | | Thickness (nm) | | |
| D1 | aSi | | 85 | | |
| D2 | SiO$_2$ | | 34 | | |
| D3 | aSi | | 162 | | |
| D4 | SiO$_2$ | | 142 | | |
| D5 | aSi | | 68 | | |
| D6 | SiO$_2$ | | 172 | | |
| D7 | aSi | | 56 | | |
| D8 | SiO$_2$ | | 19 | | |
| D9 | aSi | | 321 | | |
| D10 | SiO$_2$ | | 169 | | |
| D11a | aSi | 0 | 0 | 0 | 19 |
| D11b | aSi | 0 | 0 | 19 | 19 |
| D11c | aSi | 0 | 19 | 19 | 19 |
| D11d | aSi | 33 | 33 | 33 | 33 |
| D11e | SiN | 10 | 10 | 10 | 10 |
| D12a | SiO$_2$ | 57 | 38 | 19 | 0 |
| D12b | SiO$_2$ | | 131 | | |
| D13 | aSi | | 99 | | |
| D14 | SiO$_2$ | | 46 | | |
| D15 | aSi | | 161 | | |
| D16 | SiO$_2$ | | 62 | | |
| D17 | aSi | | 97 | | |

Filter 80 has been manufactured by successively depositing each layer D1 to D17 and by etching layers D11a to D11c at the locations where they are not present and by providing a planarization step after the deposition of layer D12a to reach the underlying layer.

Figure 14:
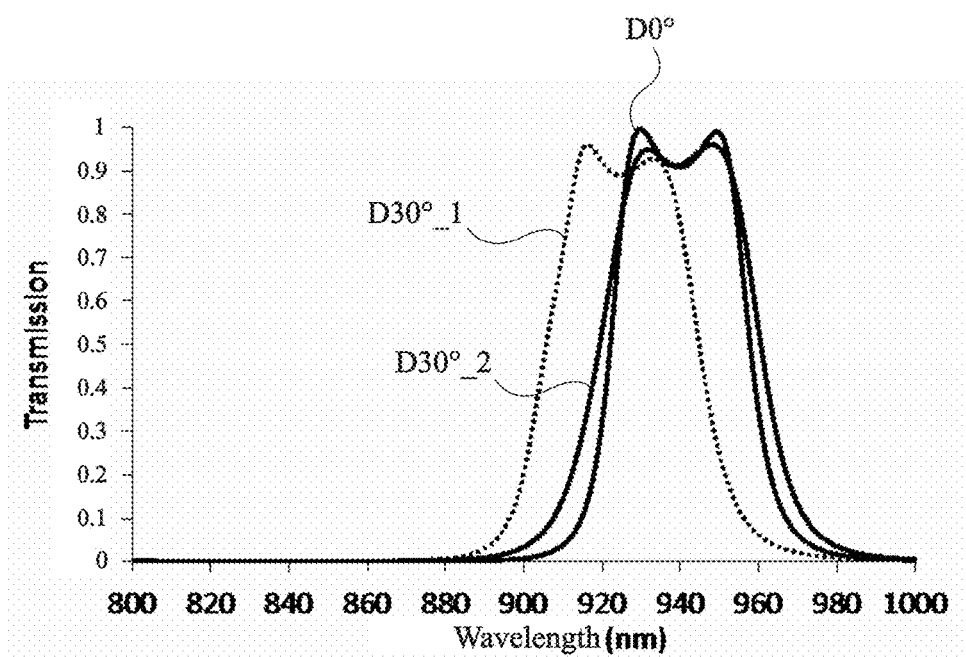
FIG. 14 shows transmission curves of filter pixels of the filter of FIG. 13.

FIG. 14 shows curves of the variation, for filter 80, of the transmission respectively of filter pixel $P_1$ receiving a radiation under a zero incidence (curve D0°), of filter pixel $P_1$ receiving a radiation under an incidence equal to 30° (curve D30°_1), and of filter pixel $P_4$ receiving a radiation under an incidence equal to 30° (curve D30°_2). The spectral response of filter pixel $P_4$ is substantially centered on 940 nm like the spectral response of filter pixel $P_1$.

Figure 15:
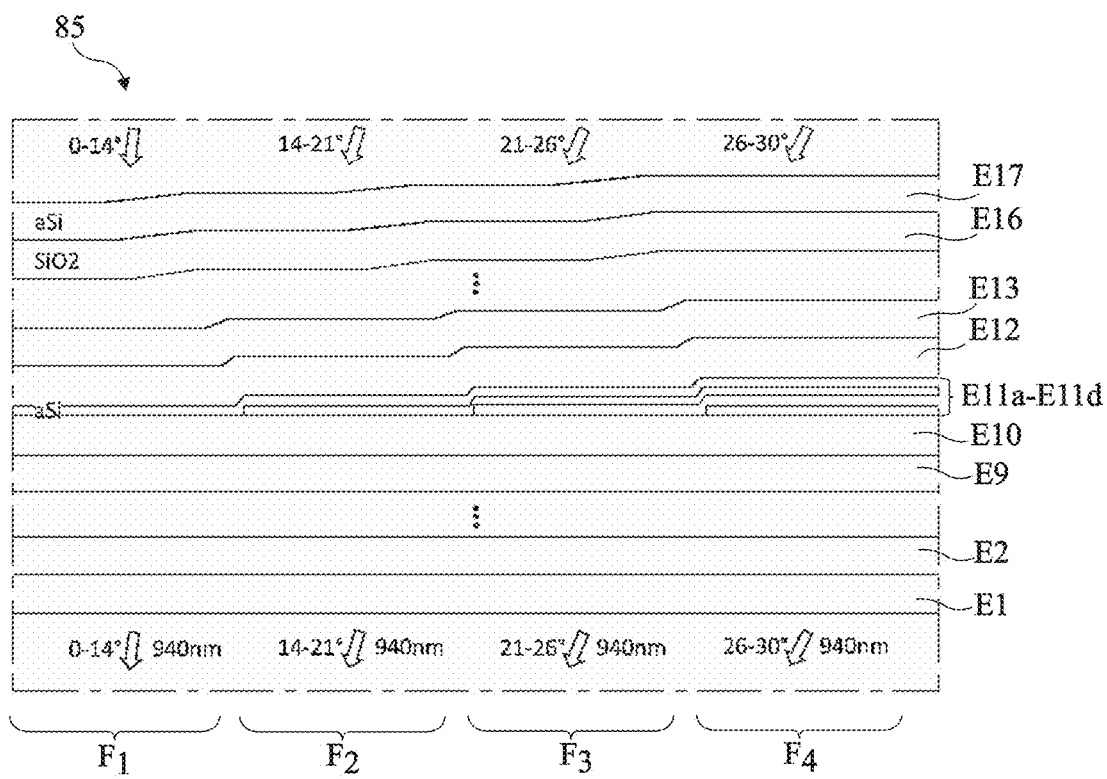
FIGS. 15 and 16 are drawings similar to FIGS. 12 and 13 of an example of comparison of an interference filter for a tilt compensation infrared sensor.

FIG. 15 shows an example of comparison of an interference filter 85 compensating the wavelength shift under a spatially variable incidence having had its spectral response determined by simulation. Interference filter 85 has the same structure as filter 80, with the difference that SiO$_2$ layer D12a is not present and that the thicknesses of the other layers may be modified.

The thicknesses and the materials forming the layers of interference filter 80 are gathered in table IV hereafter according to the filter pixels.

TABLE IV

| Layer Nr. | Material | Filter_B | Filtre G | Filtre R | Filtre IR |
|---|---|---|---|---|---|
| | | | Thickness (nm) | | |
| E1 | aSi | | 85 | | |
| E2 | SiO$_2$ | | 33 | | |
| E3 | aSi | | 162 | | |
| E4 | SiO$_2$ | | 147 | | |
| E5 | aSi | | 65 | | |
| E6 | SiO$_2$ | | 150 | | |
| E7 | aSi | | 95 | | |
| E8 | SiO$_2$ | | 10 | | |
| E9 | aSi | | 302 | | |
| E10 | SiO$_2$ | | 163 | | |
| E11a | aSi | 0 | 0 | 0 | 16 |
| E11b | aSi | 0 | 0 | 16 | 16 |
| E11c | aSi | 0 | 16 | 16 | 16 |
| E11d | aSi | 45 | 45 | 45 | 45 |
| E12 | SiO$_2$ | | 144 | | |
| E13 | aSi | | 103 | | |
| E14 | SiO$_2$ | | 45 | | |
| E15 | aSi | | 158 | | |
| E16 | SiO$_2$ | | 72 | | |
| E17 | aSi | | 95 | | |

Filter 85 has been manufactured by successively depositing each layer E1 to E17 and by etching layers E11a to E11c at the locations where they are not present.

Figure 16:
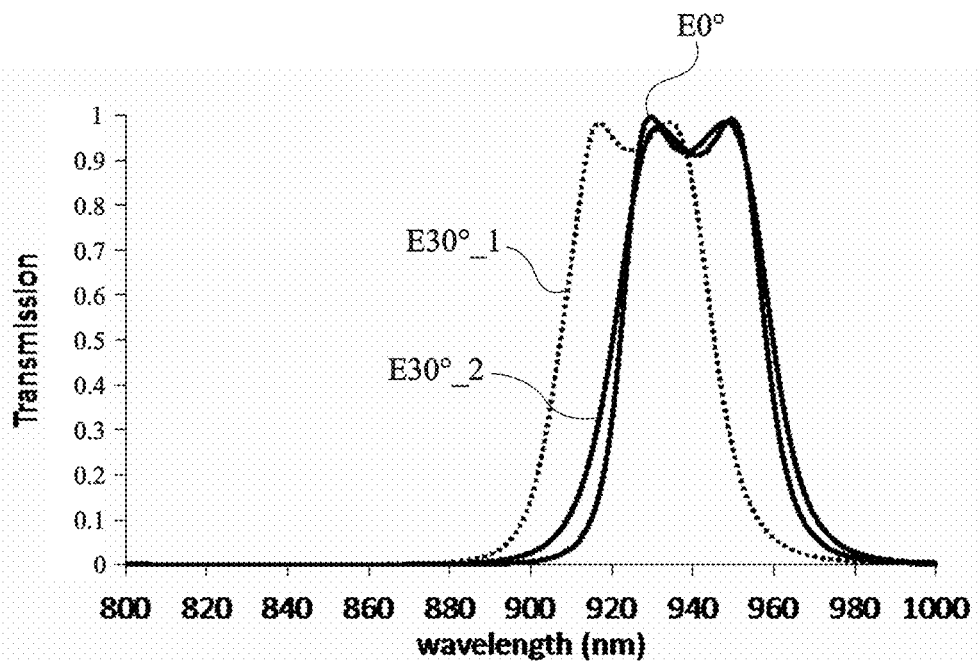

FIG. 16 shows curves of the variation, for filter 85, of the transmission respectively of filter pixel $P_1$ receiving a radiation under a zero incidence (curve E0°), of filter pixel $P_1$ receiving a radiation under an incidence equal to 30° (curve E30°_1), and of filter pixel $P_4$ receiving a radiation under an incidence equal to 30° (curve E30°_2). The spectral response of filter pixel $P_4$ is substantially centered on 940 nm like the spectral response of filter pixel $P_1$.

The transmission curves of filter 85 are substantially identical to the transmission curves of filter 80. The spectral responses of filters 85 and 80 are thus substantially identical.

For filter 85, the step height between filter pixels $F_3$ and $F_4$ for layers E11a to E11c is 16 nm. However, this structure is covered with six layers having a total thickness equal to 660 nm, which generates a spacer having a lateral dimension in the order of 500 nm above each step between filter pixels $F_3$ and $F_4$. Since the spacer is much wider than the step height, the relief is smoothed along the last six depositions. However, it is then not possible to accurately control the thicknesses deposited in the transition areas. Thereby, the signals measured on the pixels of the imager under the filter array, opposite the steps, may be disturbed, up to pixel sizes of several micrometers.

For filter 80, the step height between filter pixels $F_3$ and $F_4$ for layers D11a to D11c is 19 nm. However, the subsequent layers D12b to D17 are deposited on a planar surface.

The maximum lateral dimension of the spacers of filter 85 is in the order of 50 nm, that is, smaller than that of filter 85.

Various embodiments with different variations have been described hereabove. It should be noted that those skilled in the art may combine these various embodiments and variations without showing any inventive step.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. An interference filter comprising:
    a first planar interface layer, metallic or comprising a stack of at least two dielectric layers with a difference between refraction indexes greater than or equal to 0.5;
    N dielectric portions of a first dielectric material or of first dielectric materials resting on the first interface layer, where N is an integer greater than or equal to 2, the $i^{th}$ dielectric portion of the first dielectric material or of the first dielectric materials, where i is an integer in the range from 1 to N, comprising a stack of i layers of the first dielectric material or of the first dielectric materials, the thickness of the $i^{th}$ dielectric portion of the first dielectric material or of the first dielectric materials, where j is an integer in the range from 1 to N−1, being smaller than the thickness of the $k^{th}$ dielectric portion of the first dielectric material or of the first dielectric materials, where k is equal to j+1;
    N−1 dielectric portions of a second dielectric material, the refraction index of the second material at an operating wavelength of the filter being smaller than the refraction index of the first material or of the first materials at said wavelength, the $i^{th}$ dielectric portion of the second dielectric material resting on the $i^{th}$ dielectric portion of the first dielectric material or of the first dielectric materials, the sum of the thickness of the $i^{th}$ dielectric portion of the second dielectric material and of the thickness of the $i^{th}$ portion of the first dielectric material or of the first dielectric materials being equal to the thickness of the $N^{th}$ dielectric portion of the first dielectric material or of the first dielectric materials; and
    a second planar interface layer, metallic or comprising a stack of at least two dielectric layers with a difference between refraction indexes greater than or equal to 0.5, resting on the dielectric portions of the second dielectric material and the $N^{th}$ dielectric portion of the first dielectric material or of the first dielectric materials, in contact with the dielectric portions of the second dielectric material and the $N^{th}$ dielectric portion of the first dielectric material or of the first dielectric materials,
    the interference filter comprising, for each $i^{th}$ and $k^{th}$ dielectric portion of the first dielectric material or of the first dielectric materials, a transition area between the $i^{th}$ and $k^{th}$ dielectric portions of the first dielectric material or of the first dielectric materials, the thickness of the transition area varying from the thickness of the $i^{th}$ dielectric portion of the first dielectric material or of the first dielectric materials to the thickness of the $k^{th}$ dielectric portion of the first dielectric material or of the first dielectric materials, the maximum lateral dimension of the transition area, measured orthogonally to the stacking direction, being smaller than 50 nm.

2. The interference filter of claim 1, wherein N is greater than or equal to 3.

3. The interference filter of claim 1, wherein N is greater than or equal to 4.

4. The interference filter of claim 1, wherein the first dielectric material or the first dielectric materials are selected from the group comprising silicon nitride (SiN), amorphous silicon (aSi), hafnium oxide (HfOx), aluminum oxide (AlOx), a film made up of aluminum, oxygen, and nitrogen (AlOxNy), a film made up of silicon, oxygen, carbon, and nitrogen (SiOxCyNz), silicon nitride (SiNx), niobium oxide (NbOx), tantalum oxide (TaOx), titanium oxide (TiOx), hydrogenated amorphous silicon (aSiH), and mixtures of at least two of these compounds.

5. The interference filter of claim 1, wherein the second dielectric material is selected from the group comprising silicon dioxide (SiO2), magnesium fluoride (MgF2), silicon oxide (SiOx), silicon oxynitride (SiOxNy), hafnium oxide (HfOx), aluminum oxide (AlOx), a film made up of aluminum, oxygen, and nitrogen (AlOxNy), a film made up of silicon, oxygen, carbon, and nitrogen (SiOxCyNz), silicon nitride (SiNx), and mixtures of at least two of these compounds.

6. An image sensor comprising the interference filter of claim 1 and wherein the interference filter comprises a first elementary filter comprising a first portion of the first dielectric material or of the first dielectric materials and a first portion of the second dielectric material and a second elementary filter comprising a second portion of the first dielectric material or of the first dielectric materials.

7. The image sensor of claim 6, wherein the sensor is a color image sensor, wherein the first elementary filter is a bandpass filter centered on a first wavelength, and wherein the second elementary filter is a bandpass filter centered on a second wavelength.

8. The image sensor of claim 6, wherein the sensor is a color image sensor, wherein the first elementary filter is a bandpass filter centered on a third wavelength for a radiation at a first incidence relative to the interference filter, and wherein the second elementary filter is a bandpass filter centered on the third wavelength to within 1% for the radiation at a second incidence relative to the interference filter.

9. A method of manufacturing the interference filter of claim 1, comprising the successive steps of:
    a) depositing a first dielectric layer of the first dielectric material or of the first dielectric materials on the first interface layer;
    b) etching the first dielectric layer to remove the first dielectric layer from a first location and keep the second layer at a second location;
    c) depositing a second layer of the first dielectric material or of the first dielectric materials on the first interface layer at the first location and on the first dielectric layer at the second location; and
    d) forming the a first portion on the second layer at the first location.

10. The method of claim 9, wherein step d) comprises the steps of:
    depositing a third dielectric layer of the second dielectric material on the second layer; and
    etching the third dielectric layer to reach the second dielectric layer at the second location.

11. The method of claim 10, wherein the etching of the third dielectric layer comprises a chem.-mech. planarization step.

* * * * *

UNITED STATES PATENT AND TRADEMARK OFFICE
CERTIFICATE OF CORRECTION

PATENT NO. : 10,948,641 B2
APPLICATION NO. : 15/920349
DATED : March 16, 2021
INVENTOR(S) : Laurent Frey Page 1 of 1

It is certified that error appears in the above-identified patent and that said Letters Patent is hereby corrected as shown below:

In the Claims

At Column 15, Line 26, "$i^{th}$" should read -- $j^{th}$ --

At Column 15, Line 36, "$i^{th}$" should read -- $j^{th}$ --

At Column 15, Line 37, "$i^{th}$" should read -- $j^{th}$ --

At Column 15, Line 39, "$i^{th}$" should read -- $j^{th}$ --

At Column 15, Line 41, "$i^{th}$" should read -- $j^{th}$ --

At Column 15, Line 56, "$i^{th}$" should read -- $j^{th}$ --

At Column 15, Line 59, "$i^{th}$" should read -- $j^{th}$ --

At Column 15, Line 62, "$i^{th}$" should read -- $j^{th}$ --

Signed and Sealed this
Twenty-fifth Day of May, 2021

Drew Hirshfeld
*Performing the Functions and Duties of the
Under Secretary of Commerce for Intellectual Property and
Director of the United States Patent and Trademark Office*